United States Patent [19]

Ismail et al.

[11] Patent Number: 5,714,777
[45] Date of Patent: Feb. 3, 1998

[54] SI/SIGE VERTICAL JUNCTION FIELD EFFECT TRANSISTOR

[75] Inventors: Khalid EzzEldin Ismail, White Plains; Bernard S. Meyerson, Yorktown Heights, both of N.Y.

[73] Assignee: International Business Machines Corporation, Armonk, N.Y.

[21] Appl. No.: 803,033

[22] Filed: Feb. 19, 1997

[51] Int. Cl.$^6$ .............................. H01L 29/80; H01L 21/20
[52] U.S. Cl. ........................ 257/263; 257/616; 257/192; 437/128; 437/131
[58] Field of Search ................................. 257/263, 616, 257/191, 192; 437/128, 131

[56] References Cited

U.S. PATENT DOCUMENTS 5,367,184  11/1994  Chartre ...................... 257/616

FOREIGN PATENT DOCUMENTS 60-261176  12/1985  Japan ........................... 257/263

OTHER PUBLICATIONS

IBM Technical Disclosure Bulletin, vol. 11,#3, pp. 332–333 Aug. 1968 by Drangeid.

*Primary Examiner*—Mark V. Prenty
*Attorney, Agent, or Firm*—Robert M. Trepp

[57] ABSTRACT

A junction field effect transistor and method for making is described incorporating horizontal semiconductor layers within an opening to form a channel and a semiconductor layer through which the opening was made which forms a gate electrode surrounding the channel. The horizontal semiconductor layers may be a SiGe alloy with graded composition near the source and drain. The invention overcomes the problem of forming low resistance JFET's and provides a gate length that is easily scaleable to submicron dimensions for rf, microwave, millimeter and logic circuits without short channel effects.

25 Claims, 3 Drawing Sheets

SI/SIGE VERTICAL JUNCTION FIELD EFFECT TRANSISTOR

FIELD OF THE INVENTION

This invention relates to junction field effect transistors and more particularly to junction field effect transistors with a vertical channel having a graded alloy of SiGe to provide strain for increased mobility and an induced electric field at the source end of the channel to accelerate carriers into the channel.

BACKGROUND OF THE INVENTION

In standard metal oxide silicon (MOS) technology, speed enhancement of the field effect transistors have been typically accomplished by shrinking the device dimensions. However, there is a limitation to that due to the failure to scale various parameters when the gate length of the transistor is scaled to 0.1 microns and below. Short channel effects become very important, and also inertial effects causing the carriers (electrons) to move at a slower speed at the source end of the channel which becomes very important.

A field effect transistor with a silicon germanium layer functioning as the channel is described in U.S. Pat. No. 5,019,882 which issued on May 28, 1991 to P. M. Solomon.

A region of graded SiGe has been disclosed to enhance the acceleration of carriers in bipolar devices such as described in U.S. Pat. Nos. 4,951,115 which issued Aug. 21, 1990 to D. L. Harame et al. and 5,359,912 which issued Oct. 4, 1994 to E. F. Crabbe et al. which are assigned to the assignee herein.

Graded SiGe and strained Si and SiGe layers have been disclosed to enhance the mobility of carriers in MOS FET devices such as describe in U.S. Pat. No. 5,534,713 by K. E. Ismail and F. Stern and assigned in part to the assignee herein.

An advanced structure of a vertical JFET having an optimized bipolar operating mode is described in U.S. Pat. No. 5,367,184 Nov. 22, 1994 by A. Chantre. In order to enhance bipolar operation, a thin layer of SiGe is provided to provide a valence band discontinuity in an n channel. The thin layer extends into the channel region from the gate region for the injection of minority carriers (holes) from the gate (base) region. The thin layer of SiGe is not needed for vertical JFET operation.

SUMMARY OF THE INVENTION

In accordance with the present invention, a junction field effect transistor and a method for making is described comprising a first semiconductor layer of a first type; a second semiconductor layer of a lightly doped first type formed over the first semiconductor layer, a third semiconductor layer of a second type formed over the second semiconductor layer having an opening therein exposing a portion of the second semiconductor layer, a layer of dielectric material formed over the third semiconductor layer having an opening therein communicating with the opening in the third semiconductor layer, a fourth semiconductor layer of a first type of $Si_{1-x}Ge_x$ where x may increase from 0 to 0.1 with thickness formed on the second semiconductor layer in the opening of the third semiconductor layer, a fifth semiconductor layer of a first type of $Si_{(1-y)}Ge_y$ where Y may equal 0.15 formed on the fourth semiconductor layer in the opening of the third semiconductor layer, and a sixth semiconductor layer of a first type of $Si_{(1-z)}Ge_z$ where z may decrease from 0.15 to 0 with thickness formed on the fifth semiconductor layer in the opening of the layer of dielectric material. The first and second type semiconductor may be n and p, respectively, or p and n, respectively.

The invention provides a junction field effect transistor suitable for large scale integration (LSI) having a channel length on the order of 0.1 micron and below that is based on silicon technology which is capable of operating in the microwave and millimeter wave frequency band for satellite, wireless wide area networks and communication equipment.

The invention further provides a junction field effect transistor structure wherein the gate is self aligned with the source.

The invention further provides a junction field effect transistor structure wherein the gate length can be easily scaled down to below 0.1 microns without suffering from short channel or inertial effects.

The invention further provides a junction field effect transistor structure wherein the channel itself is made of strained SiGe such that the light electron effective mass is favored for transport in the vertical direction.

The invention further provides a junction field effect transistor structure wherein SiGe grading at the source side of the channel provides an electric field which accelerates or injects carriers (electrons) into the channel at high speeds.

The invention further provides a junction field effect transistor structure wherein SiGe grading at the drain side of the channel reduces the electric field and thus increases the breakdown voltage and the reliability of the device, and improves the current saturation and hence the gain of the transistor.

The invention further provides a junction field effect transistor structure wherein the series source and drain resistances can be extremely low since highly doped epitaxial layers can be grown without the need for ion implantation and annealing.

The invention further provides a junction field effect transistor structure suitable for bulk silicon and/or silicon-on-insulator (SOI) substrates.

The invention further provides a junction field effect transistor structure suitable for high-speed large scale integration (LSI) logic.

The invention further provides a process for making vertical junction field effect transistors which does not require ion-implantation or any high temperature steps above 560° C. if the epitaxial layers are grown by ultra high vacuum chemical vapor deposition UHV—CVD.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENT

Figure 1:
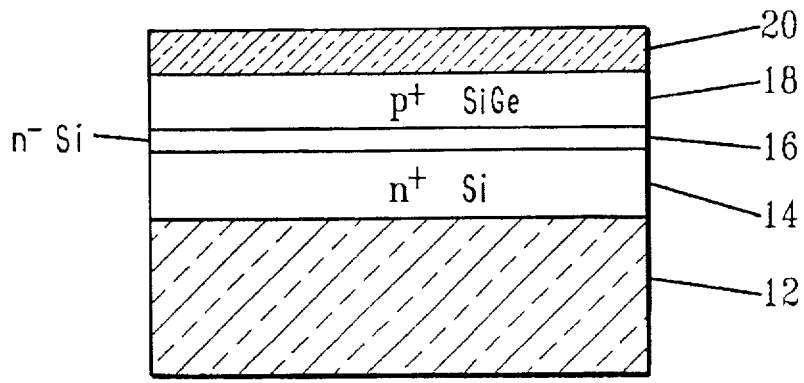
FIGS. 1–3 are cross section views illustrating the fabrication steps for building one embodiment of the invention.
Figure 2:
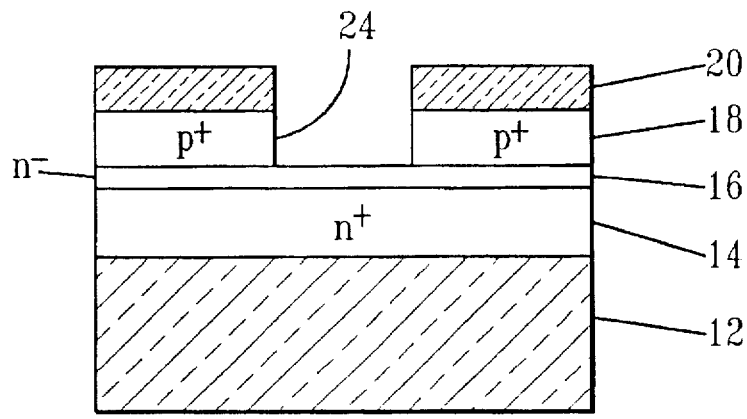
Figure 3:
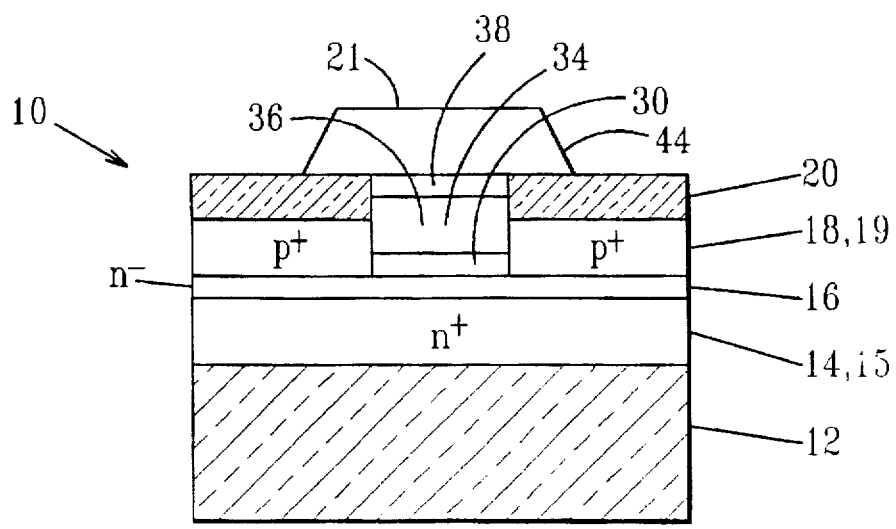

Referring now to the drawing and in particular to FIGS. 1-3, the steps in fabricating a vertical junction field effect transistor (JFET) 10 is shown. A starting substrate 12 may be an insulator such as silicon dioxide or substrate 12 may be a semiconductor such as single crystal silicon, silicon germanium or silicon on insulator. A single crystal layer 14 of a semiconductor such as silicon or silicon germanium, doped p- may be formed over substrate 12. Starting substrate 12, if an insulator, and layer 14 may be formed by separation by ion implantation of oxygen (SIMOX) which is well known in the art or by bond and etch back of an oxide coated wafer and a semiconductor carrier substrate to form silicon-on-insulator (BESOI). Layer 14 may be heavily doped n+ to form the drain electrode 15 of JFET 10 shown in FIG. 3.

An epitaxial layer 16 is formed on layer 14 which may be doped n- to reduce the capacitance to a gate layer 18 which is subsequently epitaxially formed over layer 16. Gate layer 18 may be for example Si or SiGe, doped p+ and have a thickness in the range from 30–100 nm. Next, a layer of dielectric 20 such as silicon oxide is formed over layer 18 and functions to reduce the capacitance to the source electrode 21 which is subsequently formed above.

The growth temperature for the Si and SiGe epitaxial layers may be in the range from 500 to 560° C. which will be the highest temperature required to fabricate JFET 10 if ultra high vacuum chemical vapor deposition (UHV—CVD) is used as described in U.S. Pat. No. 5,298,452 which issued Mar. 29, 1994 to B. S. Meyerson, assigned to the assignee herein and is incorporated herein by reference. However, the epitaxial layers are not specific to UHV—CVD and could also be grown by low pressure epitaxy (LPE) in a temperature range from 700°–800° C.

Figure 4:
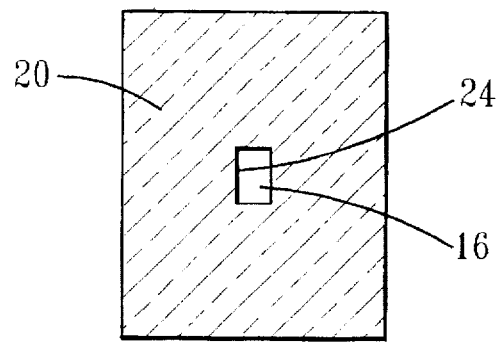
FIG. 4 is a top view of FIG. 2.

Next, a window 24 is opened in layer 20 which may be for example, 1×1 μm, formed for example by etching. Next, window 24 is extended through gate layer 18 such as by reactive ion etching (RIE) which may be terminated at layer 16 selectively. If layer 18 is an alloy of SiGe and layer 16 is Si then a change in the index of refraction during RIE may be used to stop etching when layer 16 is exposed. A top view of window 24 is shown in FIG. 4.

U.S. Pat. No. 5,395,769 which issued on Mar. 7, 1995 to M. Arienzo et al. describes a method for controlling silicon etch depth which may be used to stop the etching at the appropriate depth which is incorporated herein by reference.

Next, an epitaxial graded layer 30 of SiGe is grown in window 24 on layer 16. Graded layer 30 of $Si_{(1-x)}Ge_x$ may be doped n- and x may be 0 at layer 16 and changes as a function of layer thickness to about 0.1 at the upper surface 31. Next an epitaxial layer 34 of $Si_{1-y}Ge_y$ is grown on layer 16 where y is constant at about 0.15. Layer 34 forms the center portion of channel 36 of JFET 10. Next, an epitaxial graded layer 38 of $Si_{(1-z)}Ge_z$ is grown on upper surface 37 of layer 34 where z changes as a function of layer thickness from about 0.15 at surface 37 to 0 at the upper surface 39 of layer 38.

The choice of Ge concentration profile in layers 30 and 38 and the Ge content in layer 34 is dictated by the lattice mismatch with respect to layers 14 and 16. The concentration profiles combined with the thickness of layers 30, 34 and 38 needed in JFET 10, will result in fully strained layers 30, 34 and 38 without generation of dislocations to relieve the strain.

If the first type is p type and the second type is n type then channel 36 would be p type. Layers 30 and 38 are still needed to be graded in the same way. There is strain in all directions. When we say compressive, we typically mean that a larger lattice is grown on a smaller lattice such that its in-plane lattice constant has to be compressed to adjust to the underlying lattice constant. By doing so, however, the lattice of the layer grown on top, which is under compressive strain in the plane, is under tensile strain in the perpendicular direction (the current flow direction shown by arrow 50 in FIG. 6).

The epitaxial deposition or growth of layers 30, 34 and 38 is preferential or selective to layers 30, 34 and 38 and no nucleation on layer of dielectric 20 such as silicon oxide occurs. Other suitable oxides for a masking layer are described in U.S. Pat. No. 5,427,630 which issued on Jun. 27, 1995 to C. Cabral, Jr. et al., assigned to the assignee herein and incorporated herein by reference.

Figure 5:
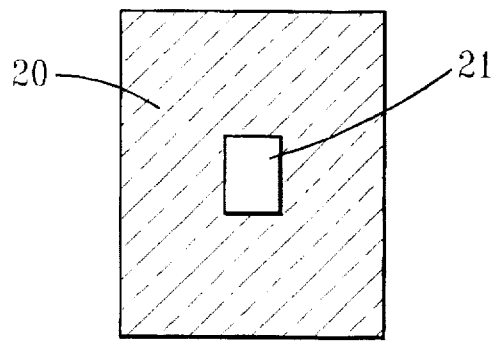
FIG. 5 is a top view of FIG. 3.
Figure 6:
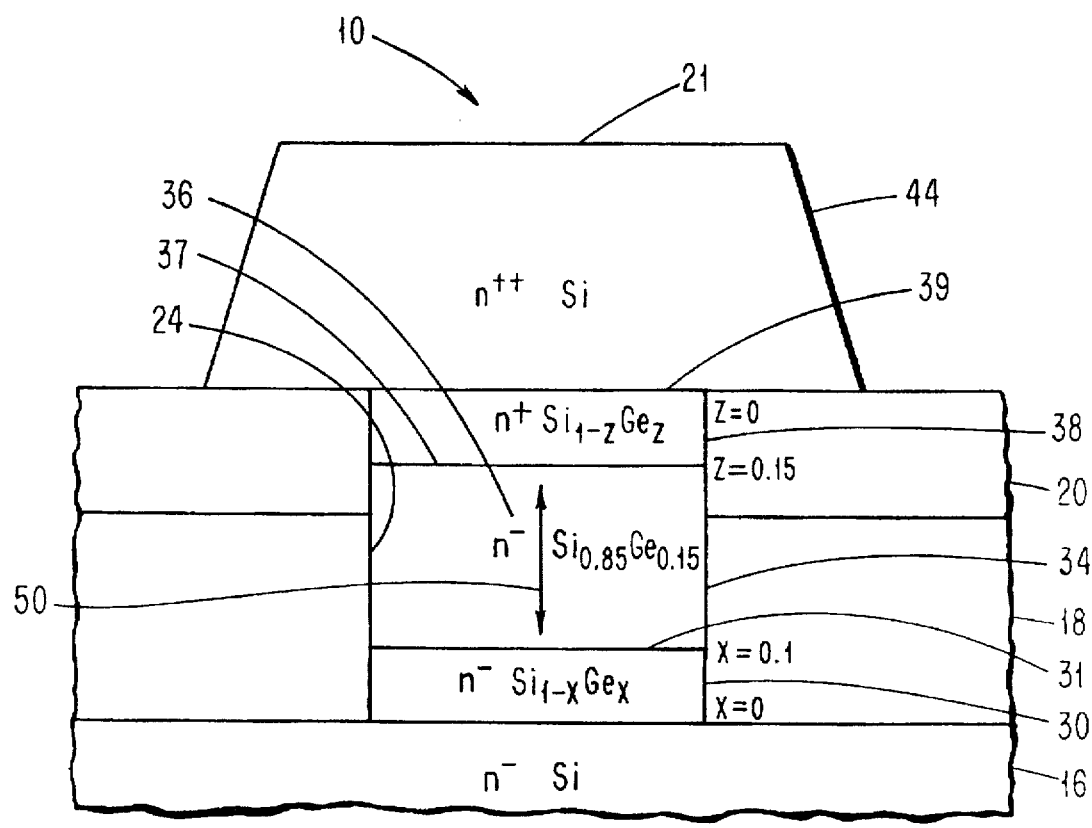
FIG. 6 is an enlarged cross section view of a portion of FIG. 3.

Next, a layer 44 of conductive material such as Si is deposited over layer 38 and over dielectric layer 20 which is subsequently patterned as shown in FIGS. 3, 5, and 6. Layer 44 may be heavily doped n++ and functions to provide the source electrode 21 of JFET 10.

The bottom layer 14 and the top layer 44 constitute the drain electrode 15 and source electrode 21, respectively, of JFET 10. p type layer 18 constitutes the gate electrode 19 of JFET 10 and completely surrounds conducting channel 36 from all four sides. Thus gate electrode 19 has perfect control on the charge carriers and short channel effects are not possible. With gate electrode 19 on all sides of channel 36, the modulation efficiency of JFET 10 is optimized. JFET 10 however would be operable with gate electrode 19 on two sides of channel 36.

The grading z of Ge in SiGe layer 38 and the choice y of Ge content is selected such that an electric field is induced at the source side of channel 36, which accelerates the electrons and launches them into channel 36 at already a high speed, thus avoiding the inertial effect problem. Channel 36 itself is made of strained SiGe such that the light electron effective mass is favored for transport in the vertical direction shown by arrow 50 in FIG. 6. The grading x of Ge in SiGe layer 30 at the drain side of channel 36 reduces the electric field and thus increases the breakdown voltage and the reliability of the device, and improves the current saturation and hence the gain of the transistor. Partial grading of Ge just at the source side or just at the drain side is possible in the fabrication and operation of JFET 10.

Since the gate length is determined by the thickness of p type layer 18, the thickness of layer 18 can be easily scaled down to sub 0.1 dimensions such as in the range from 0.1 μm or 100 nm to 30 nm, with about 1 nm accuracy.

The gate length or thickness of p type layer 18 can be from a few nanometers such as 5 nm up to many 100s of nanometers. The range of 30 to 100 nm was given as optimum mainly because as layer 18 is made thinner, the resistance of p layer 18 becomes higher and hence one may run into diminishing returns i.e. the RC time constant of the gate. A gate length as short as 5 nm is possible.

The series source and drain resistances can be extremely low since highly doped epitaxial layers can be grown without the need for ion implantation and annealing. Parasitic capacitances are minimized by using SOI wafers such as made by the SIMOX process, by adding the lightly doped n-layer 16 underneath p type layer 18 and by the dielectric layer 20 on top of p type layer 18. n-layer 16 below the gate, layer 18, is useful to make electrical contact to the device. The intrinsic switching time of JFET 10 as shown in FIGS. 3, 6 and 7 is estimated to be below 1 ps for a gate length of 50 nm.

Figure 8:
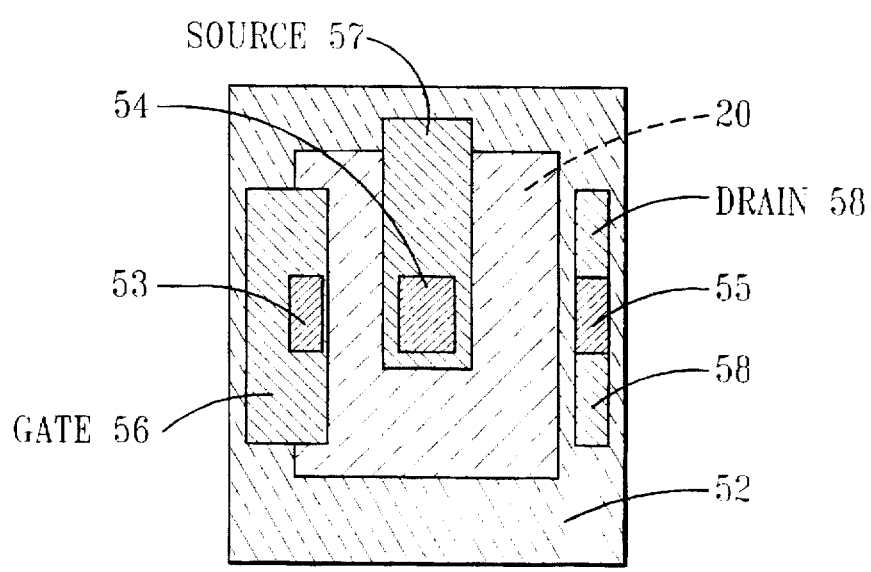
FIG. 8 is a top view of FIG. 7.
Figure 7:
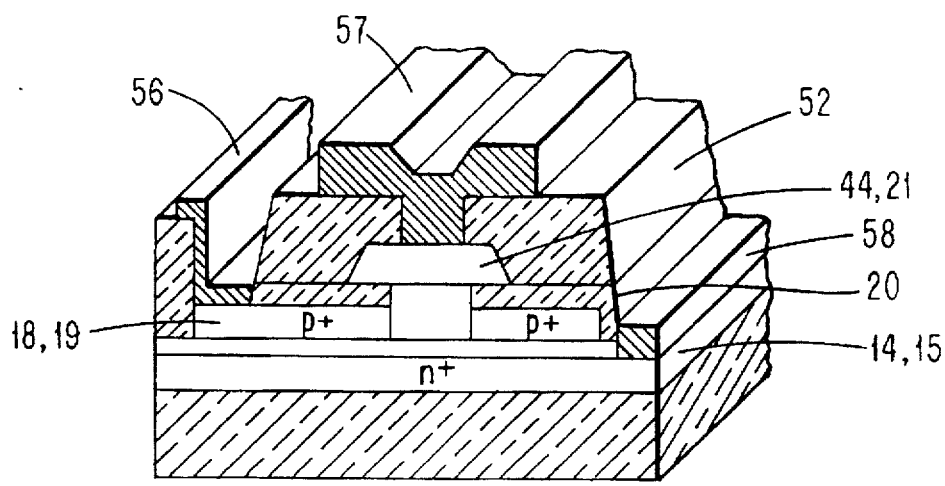
FIG. 7 is a three dimensional view of a cross section of the embodiment of FIG. 3 with the addition of electrode contacts.

Referring to FIGS. 6, 7 and 8, a dielectric layer 52 may be formed over patterned layer 44 and over dielectric layer 20. Windows 53–55 may be opened in dielectric layer 52 by etching to expose gate electrode 19, source electrode 21 and drain electrode 15. A layer of metal or epitaxially-grown highly doped poly Si or Si/SiGe can be deposited and patterned as interconnects 56–58 shown in FIGS. 7 and 8. If interconnects 56–58 are metal, the contacts to the silicon may be made by metal sintering at 400° C. for 1 to 5 minutes. Gate electrode 19 and drain electrode 15 can also make use of the highly doped n layer 14 and p layer 18, respectively, as interconnects defined by reactive ion etching. JFET 10 can be used in rf, microwave and millimeter wave amplifier circuits as well as in high-speed LSI logic.

While there has been described and illustrated a vertical junction field effect transistor containing a gate which completely surrounds the channel and wherein the gate length is scaleable to tens of nanometers, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A junction field effect transistor comprising:

a first semiconductor layer of a first type;

a second semiconductor layer of a lightly doped first type formed over said first semiconductor layer, a third semiconductor layer of a second type formed over said second semiconductor layer having an opening therein exposing a portion of said second semiconductor layer, a layer of dielectric material formed over said third semiconductor layer having an opening therein communicating with said opening in said third semiconductor layer, a fourth semiconductor layer of a first type of $Si_{1-x}Ge_x$ where x increases with thickness formed in said opening of said third semiconductor layer, a fifth semiconductor layer of a first type of $Si_{1-y}Ge_y$ where Y is substantially constant with thickness formed in said opening of said third semiconductor layer, and a sixth semiconductor layer of a first type of $Si_{1-z}Ge_z$ where z decreases with thickness formed in said opening of said layer of dielectric material.

2. The junction field effect transistor of claim 1 further including an insulating substrate below said first semiconductor layer.

3. The junction field effect transistor of claim 1 further including a seventh semiconductor layer of a first type of Si formed over said layer of dielectric material and over said sixth semiconductor layer.

4. The junction field effect transistor of claim 1 wherein said third semiconductor layer and said layer of dielectric material have a plurality of openings wherein openings in said layer of dielectric material communicate with respective openings in said third semiconductor layer and wherein openings in said third semiconductor layer expose portions of said second semiconductor layer.

5. The junction field effect transistor of claim 4 further including a seventh semiconductor layer of a first type formed over said layer of dielectric material and over said sixth semiconductor layer in said plurality of openings to interconnect a plurality of channels formed by said fourth and fifth semiconductor layers in respective openings of said plurality of openings.

6. The junction field effect transistor of claim 1 wherein said first type is n and said second type is p.

7. The junction field effect transistor of claim 1 wherein said first type is p and said second type is n.

8. The junction field effect transistor of claim 1 wherein said third layer has a predetermined thickness and forms the gate electrode.

9. The junction field effect transistor of claim 8 wherein said thickness is in the range from 30 to 100 nm.

10. The junction field effect transistor of claim 8 wherein the thickness of said third layer determines the channel length of said transistor.

11. The junction field effect transistor of claim 1 wherein said fifth layer is strained such that transport of the light electron effective mass is favored for transport in said fifth layer transverse to said third layer.

12. The junction field effect transistor of claim 1 wherein said sixth layer is graded whereby an electric field is induced which accelerates carriers and launches the carriers into said fifth layer at high speed.

13. The junction field effect transistor of claim 1 wherein said fifth layer is said opening extends above the interface of said third semiconductor layer and said layer of dielectric material.

14. The junction field effect transistor of claim 1 wherein x increases from about 0 to about 0.1.

15. The junction field effect transistor of claim 1 wherein y is in the range from about 0.1 to about 0.3.

16. The junction field effect transistor of claim 1 wherein z decreases from about 0.15 to about 0.

17. A method for fabricating a junction field effect transistor comprising the steps of:

forming a first semiconductor layer of a first type;

forming a second semiconductor layer of a lightly doped first type over said first semiconductor layer, forming a third semiconductor layer of a second type over said second semiconductor layer having an opening therein exposing a portion of said second semiconductor layer, forming a layer of dielectric material over said third semiconductor layer having an opening therein communicating with said opening in said third semiconductor layer, forming a fourth semiconductor layer of a first type of $Si_{1-x}Ge_x$ where x increases with thickness in said opening of said third semiconductor layer, forming a fifth semiconductor layer of a first type of $Si_{1-y}Ge_y$ where y is substantially constant with thickness in said opening of said third semiconductor layer, and forming a sixth semiconductor layer of a first type of $Si_{1-z}Ge_z$ where z decreases with thickness in said opening of said layer of dielectric material.

18. The method of claim 17 further including the step of forming a seventh semiconductor layer of a first type of Si over said layer of dielectric material and over said sixth semiconductor layer.

19. The method of claim 17 further including the step of forming a plurality of openings in said layer of dielectric material and said third semiconductor layer to expose portions of said second semiconductor layer.

20. The method of claim 19 further including the step of forming a seventh semiconductor layer of a first type over said layer of dielectric material and over said sixth semiconductor layer in said plurality of openings to interconnect a plurality of channels formed by said fourth and fifth semiconductor layers in respective openings of said plurality of openings.

21. The method of claim 17 further including the step of grading the composition of Ge in SiGe in said fourth semiconductor layer whereby said fifth layer is strained such that transport of the light electron effective mass is favored for transport in said fifth layer transverse to said third layer.

22. The method of claim 17 further including the step of grading the composition of Ge in SiGe in said sixth layer whereby an electric field is induced which accelerates carriers and launches the carriers into said fifth layer at high speed.

23. The method of claim 17 wherein said step of forming a fourth semiconductor layer includes increasing x from about 0 to about 0.1.

24. The method of claim 17 wherein said step of forming a fifth semiconductor layer includes setting y in the range from about 0.1 to about 0.3.

25. The method of claim 17 wherein said step of forming a sixth semiconductor layer includes decreasing z from about 0.15 to about 0.

* * * * *